US008492665B1

(12) United States Patent
Yang

(10) Patent No.: US 8,492,665 B1
(45) Date of Patent: Jul. 23, 2013

(54) APPARATUS AND METHODS FOR CAPACITIVE SENSING AND CAPACITANCE MEASURING

(76) Inventor: Jiandong Yang, Pleasanton, CA (US)

( * ) Notice: Subject to any disclaimer, the term of this patent is extended or adjusted under 35 U.S.C. 154(b) by 971 days.

(21) Appl. No.: 12/539,231

(22) Filed: Aug. 11, 2009

Related U.S. Application Data

(60) Provisional application No. 61/087,849, filed on Aug. 11, 2008.

(51) Int. Cl.
*G06F 3/044* (2006.01)

(52) U.S. Cl.
USPC ........................... 178/18.06; 345/174

(58) Field of Classification Search
None
See application file for complete search history.

(56) References Cited

U.S. PATENT DOCUMENTS

2007/0046639 A1* 3/2007 Swedin .................. 345/173
2007/0268265 A1* 11/2007 XiaoPing ................ 345/173

* cited by examiner

*Primary Examiner* — Wayne Young
*Assistant Examiner* — Brian Butcher

(57) ABSTRACT

One embodiment of an apparatus for capacitive sensing and capacitive measuring having a digital circuitry (16) which has a digital input port P1 communicating with a capacitive sensing element (10). A resistance element (12) forms an electrical pathway between the sensing element and a signal generator (18) by electrically communicating with both. The signal generator outputs adjustable singles to charge and discharge the sensing element. The voltage Vc of the sensing element at the input port P1 will cause logic level change between "1" and "0" inside the digital circuitry when passing through the logic threshold of the digital circuit. The digital circuitry measures the time between the logic level changes and the reference points of the signals, and then calculates the capacitance or the capacitance change. The digital circuitry can be a microcontroller and the signal source can be the microcontroller's output port. Other embodiments are described and shown.

11 Claims, 8 Drawing Sheets

APPARATUS AND METHODS FOR CAPACITIVE SENSING AND CAPACITANCE MEASURING

CROSS-REFERENCE TO RELATED APPLICATIONS

This application claims the priority of a U.S. Provisional Application for Patent filed on Aug. 11, 2008 and having Ser. No. 61/087,849

FEDERALLY SPONSORED RESEARCH

None.

SEQUENCE LISTING OR PROGRAM

None.

BACKGROUND OF THE INVENTION

1. Field

This invention relates to capacitive sensing and capacitance measuring, specifically to capacitive key touch detection.

Capacitive sensing detects the presence or absence of a conductive object, such as a human finger.

2. Prior Art

Capacitive touch sensing technology has a wide range of applications in electronic equipment. A touch sensing controller IC (integrated circuit) is the key component in touch sensing enabled systems, such as equipment with touch keys or a touch screen. As the touch sensing technology is needed by many low-end applications, the cost of the sensing controller becomes more sensitive. In another aspect, as the controller ICs are more relatively affordable, more new applications will be seen for touch sensing technology. Also, the price is always a competitive factor in market. As always, a simpler design and less pin count of IC components can bring the cost down for development and fabrication. There are some capacitive touch sensing technologies that are popularly used in the real product. Notable among those are:

1. Relaxation oscillator method. In this method, the capacitive sensing element is part of a relaxation oscillator. The capacitance and the change can be calculated by measuring the oscillation frequency.

2. ADC based methods. The voltage amplitude of the capacitor at the certain time during charge or discharge is sampled by ADC. The amplitude and it differences can be used to calculate the capacitance and its change.

3. Switched-capacitor or charge transfer. The capacitors with sequential-controlled switches are used. This kind of approaches is described in the documents such as U.S. Pat. Nos. 6,466,036 B1, and 7,015,705.

The existing capacitive touch sensing methods are seen to have disadvantages and problems, which are listed below, especially in touch key applications and when compared to the mechanical key detection, which uses digital input ports to detect open/short resistive contact for key press and timers to handle de-bouncing.

a) analogue design technology has to be used for designing comparator, ADC (analogue to digital converter), an analog multiplexer, etc. The design of a mixed-signal IC, which has both digital and analog circuitry, requires a high level of expertise and careful use of computer aided design (CAD) tools. Automated testing of the finished chips can also be challenging.

b) each key needs multiple pins for the sensing controller.

c) control and measurement ports or pins need to be switched to different modes, which adds the complexity of the circuit design or system design. Also the fast switching control from switched-capacitor may bring noise and EMI issues potentially.

d) when the port to connect keys are not used, it may not be able to use as other purposes.

e) each method is only suitable to be used for a certain number range of keys because of per-key cost. A component vender has to have different production lines and use different technologies to cover the applications with different number of keys.

SUMMARY OF THE INVENTION

A capacitive touch sensing and capacitance measuring system comprises of a capacitive sensing element, a digital circuitry with a digital input port connecting to the sensing element, a voltage signal generator, and a resistance element bridging the sensing element and the signal source.

In accordance with one embodiment, a capacitive sensing element can be constructed by a single conductive plate, which is modeled as a grounded capacitor. Because one of the major anticipated applications of the invention is the key of a control panel or a keyboard, the sensing elements are sometimes hereinafter referred to as "keys".

Each key is associated with a voltage signal generator. If more than one key is used in a system, the signal generator can be shared. The sensing element capacitor is charged and discharged by a waveform from the signal generator. The amplitude of the waveform is adjustable.

The measurement can be done from both charge and discharge periods. The intrinsic logic threshold voltage of the digital input port is used as one reference point to measure the charge/discharge time. Only the input port or I/O port with single input mode is required for the measurement.

DETAILED DESCRIPTION

FIGS. 1a to 1d—First Embodiment

Figure 1A:
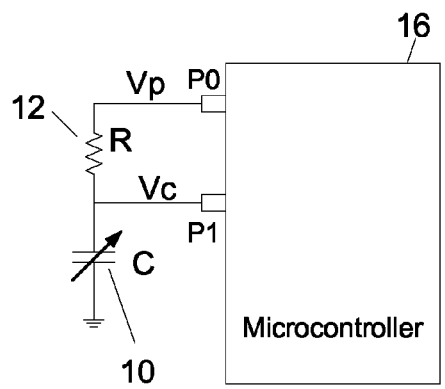
FIG. 1A is a basic configuration of a capacitive sensing system.

FIG. 1A illustrates an embodiment of a capacitive sensing system to which the invention is applied.

A capacitor 10 represents a capacitive sensing element, or capacitive sensor, with the capacitance value C. The variation of the capacitance C means the additional capacitance from an object being sensed or detected is introduced into the system.

A microcontroller 16 has at least one digital input port P1. Generally, a microcontroller is formed of a CPU, RAM, ROM, input/output ports, and timers/counters. Microcontroller 16 needs firmware program running inside to be functional. More specially, microcontroller 16 executes the program to output logic high or low signal through its digital output ports, and also read in logic values from digital input ports. P0 is an output port. P1 is an input port. The internal digital circuitry of microcontroller 16 only process and store the logic value "1" and "0".

A resistor 12 with resistance R is used to serially connect capacitor 10 to output port P0 of microcontroller 16. From output port P0 to resistor 12, capacitor 10, and then to the ground, forms an electric charge and discharge path. When a voltage Vp from output port P0 is applied to the path, the larger the time constant τ=R*C, the slower the voltage Vc of capacitor 10 to follow Vp. In another words, the time constant value can decide the shape of the signal Vc, or the charge and discharge speed.

Figure 1C:
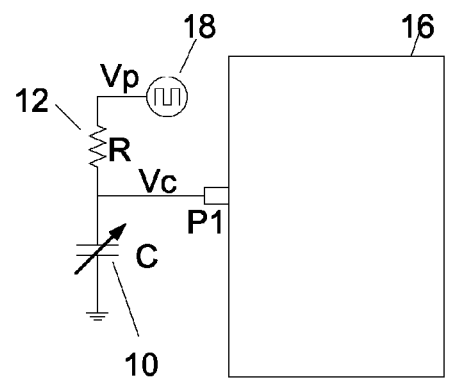
FIG. 1C is an illustration of an implementation with an independent signal generator.
Figure 1B:
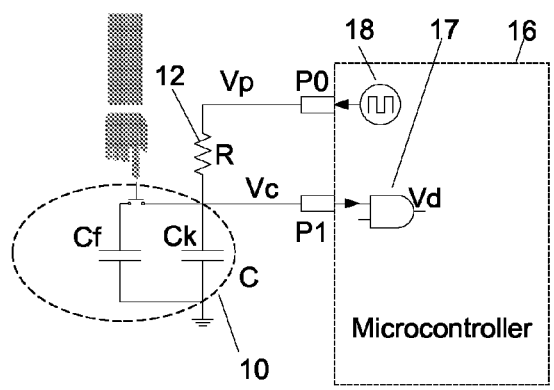
FIG. 1B is an illustration of a human figure touch introducing a capacitor.

FIG. 1B is based on FIG. 1A, and specially illustrates one example of a capacitive touch key application in accordance with the invention. Capacitor 10 here is illustrated with two portions, one with capacitance Ck and another one with Cf. Ck is the natural capacitance value of a capacitive sensing key, which can be constructed by a single metal pad on a PCB (printed circuit board) as an example. Cf represents the capacitance of a parallel-connected capacitor that needs to be measured or the capacitance variation portion of the capacitor 10. For the touch key detection application, Cf is the capacitance introduced by a human finger touching or approaching capacitive key 10. A total equivalent capacitance is C=Ck+Cf for capacitor 10.

The capacitance Ck is limited most of the time in a practical system such as the electrode area or materials used, for example 10 pf. Normally the capacitance introduced by human finger Cf is about 5-15 pf. In this case, R normally needs to be a very high resistance, such as 2 M ohm or more, to get a proper time constant τ=R*C. When R=2.0M ohm, Ck=10 pf, Cf=10 pf, C=Ck+Cf=20 pf, then the time constant τ=RC=40 μs. When P1 output jumps from 0 to Vp the voltage Vc will reach 63% of Vp after time τ.

A logic gate 17 represents the interface of a normal digital input port of microcontroller 16 or any other digital integrated circuitry. For a digital input port, there is a threshold voltage Vth1. When the input voltage Vc goes higher than Vth1, the logic gate will output the logic high "1". There is also a threshold voltage Vth0 when the input voltage goes lower that it, the logic gate will output logic low "0". For a CMOS device input, normally Vth1=Vth0=Vth.

A signal generator 18 outputs waveforms through output port P0. When it is a module in microcontroller 16, it can be a dedicated hardware circuitry, or a firmware module. If output port P0 is a general purpose digital output port, the voltage output Vp is either a logic high "1" level or logic low "0" level, which absolute voltage value depends on the I/O power supply of the microcontroller. For example, the power supply of the microcontroller is +5 v, and the logic high might be +4.8V. If a DAC (Digital to Analogue Converter) is available in the system, it also can be used to generate an adjustable signal to improve the measurement resolution and margin.

Signal generator 18 also can be an independent unit outside of microcontroller 16 (See FIG. 1C). This gives the flexibility to the implementation.

Figure 1D:
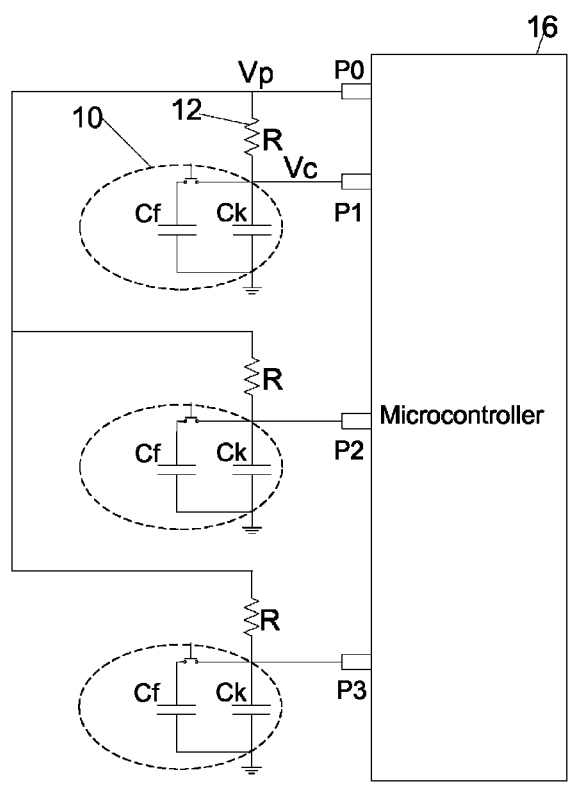
FIG. 1D is an example of multiple capacitive touch keys.

FIG. 1D shows an example of a sensing system with multiple capacitive touch keys. It is a simple expansion from FIG. 1B. In this implementation, each key unit requires a resistor and a digital input port (P1, P2, or P3) of microcontroller 16. All key units share the same output port P0 of microcontroller 16. When to implement a system with n keys, n resistors, n digital input ports and 1 output port are needed.

Operation—FIGS. 3A-3C, 4A, 4B

For the example of the embodiment to detect key touch in FIG. 1B, when the digital logic high voltage from output port P0 is applied to the serial connected resistor-capacitor-ground path, the voltage Vc on capacitor 10 will be gradually charged towards logic high voltage level. When port P0 switches to logic low voltage, Vc will be discharging. The capacitance variation of capacitor 10 will result in the variation of the time to charge Vc to a certain voltage level. The same situation is in discharge period also. The principle of the detection given below is to measure each charging or discharging time and calculate the differences along with the pulses. Then, the differences can be used to decide if the key was touched or not, or to calculate the capacitance and the change.

The following operation explanations include the theoretical analysis. The theoretical analysis is based on the ideal models with some assumptions, such as that signal generator 18 is an idea signal source and the digital input port does not provide a current path, which means the output impedance of the signal source is zero and the input impedance of the digital input port is infinitive. Or in other words, the non-ideal factors have been considered into the parameters such as resistance R and capacitance C. The theoretical analysis only gives the directions to do the design and to choose the parameters, and help to understand the principles this invention is based on.

Figure 3A:
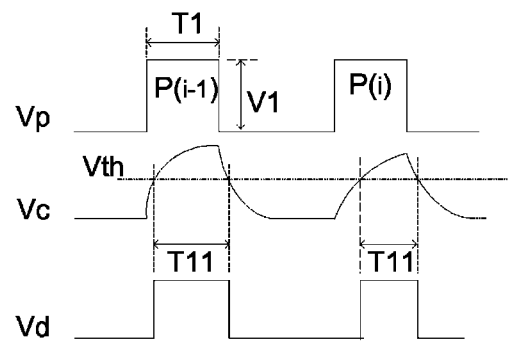
FIG. 3A shows the waveforms for measuring the duration of logic "1" of the input.
Figure 3B:
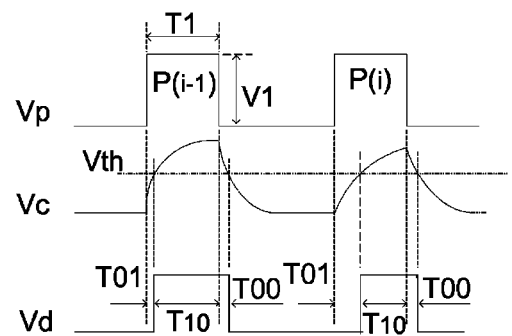
FIG. 3B shows the various time values used for measuring the capacitance.

1) Signal generator 18 generates pulses P(i−1), P(i), ... with voltage amplitude V1 and duration T1, as shown in FIGS. 3A and 3B. After the pulses change from "0" to "1", the logic high "1" voltage V1 charges the capacitor 10 through resistor 12. The voltage Vc on capacitor 10 directly outputs to a digital input port P1 of microcontroller 16. When capacitor 10 is charged from 0 Volt, the voltage on capacitor 10 changing along with the time t can be expressed theoretically as $$Vc = V1*(1-\exp(-t/(RC))) \tag{1}$$

The discharge from Vc=V10 to 0 Volt can be expressed as $$Vc = V10*\exp(-t/(RC)) \tag{2}$$

2) Microcontroller 16 reads the logic value "1" or "0" of Vd from digital input port P1. Before the voltage Vc on capacitor 10 reaches the logic "1" threshold Vth, microcontroller 16 reads in "0". When the voltage Vc goes beyond the threshold Vth, microcontroller 16 reads in logic "1". After Vc discharges below the logic "0" threshold, microcontroller 16 reads in "0".

The times in each charge or discharge phase can be estimated as follows:

As shown in FIG. 3B, T01 is the time when Vc is charged from 0 to the threshold voltage Vth. From expression (1), we can get $$T01 = \ln(1/(1-(Vth/V1)))*RC = [\ln(1/(1-(Vth/V1)))*R]*C \tag{3}$$

Figure 3C:
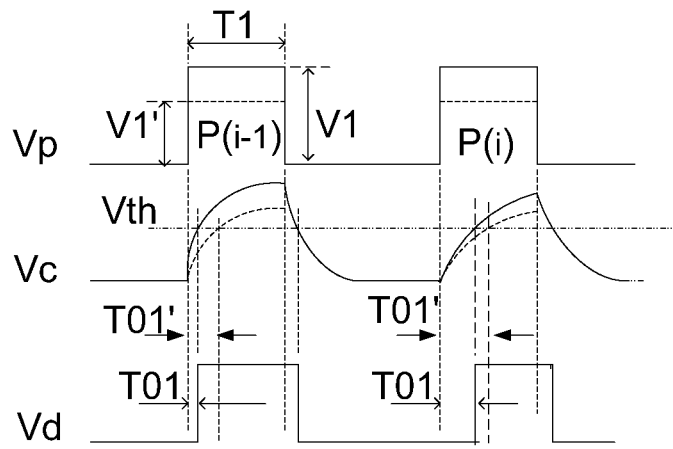
FIG. 3C shows that measurement resolution is increased by adjusting the signal amplitude.

From the expression (3), we can see that when the ratio Vth/V1 increases, T01 will increase. The larger T01, the higher measurement resolution of the capacitance C can get when R is fixed in the system. FIG. 3C shows when Vp decreases from V1 to V1', the time data T01 increases from T01 to T01'. A simple calculation shows when V1=2*Vth, T01=0.69RC, V1=1.5*Vth, T01=1.10*RC.

In the implementation side, either increasing Vth or decreasing V1 can increase the ratio Vth/V1. Increasing Vth requires a change in circuit design, but that may cause it to be incompatible with other logic circuits. In a practice system, since one signal is to be shared by multiple keys, it might be easy to change V1. Some examples to adjust amplitude V1 include using a DAC or its equivalent PWM, using an independent pulse generator, adding external components outside the port P0, or using the digital output port from other circuits with the lower voltage power supply.

As shown in FIG. 3B, T10 is the time when Vc is charged from the threshold voltage Vth to the time the pulse Vp becomes "0". From the expression (1), we also can get $$T10 = T1 - T01 \quad (4)$$

When T1 is a fixed number, T10 has the same information as T01 for measurement.

As shown in FIG. 3B, T00 is the time capacitor 10 discharges from Vc=V10 to Vth. When t=T1, V10=V1*(1−exp(−T1/(RC))). From (2), we can get $$T00 = \ln(V10/Vth)*RC \quad (5)$$

From (5), it can be seen when the discharge phase is measured that it's better to let capacitor 10 charge as high as possible. Vc will reach 99% of V1 after the time 5τ from (1). Of course, decreasing Vth also can increase T00. Therefore, if T01 and T00 are used together for the measurement, when Vp was adjusted to a lower amplitude level during T01 measurement, Vp should be changed to a higher level after Vc reaches Vth.

As shown in FIG. 3A, T11 is the duration when the voltage Vc of capacitor 10 is higher than Vth, or the time Vd stays in logic high. We can see T11=T10+T00. T11 measurement allows the use of an independent signal source without synchronizing the rising or falling edge of Vp waveform.

3) When C changes from Ck to Ck+Cf, such as when a human finger touches the capacitive key, the time is longer for the voltage Vc to reach the same voltage level, for example Vth. The difference in time can be calculated by microcontroller 16. The larger the difference between the time data, the better the measurement resolution and decision margin would be. The factors affecting the resolution and margin include the charging pulse width T1 and its voltage level V1, the voltage level of the logic threshold Vth, the capacitance Ck, and resistance R.

The following discussions use T01, the charging phase, as an example. However, the same method can be used for T00, T10, and T11.

Assume T01(i−1) and T01(i) are the time T01 measured before and after the new capacitance Cf is added in, we have $$T01(i-1) = \ln(1/(1-(Vth/V1)))*R*Ck \quad (6)$$

$$T01(i) = \ln(1/(1-(Vth/V1)))*R*(Ck-Cf) \quad (7)$$

For the measurement purpose, we get T01(i)/T01(i−1)= (Ck+Cf)/Cf from above expressions (6) and (7). Then, with a known capacitance Ck, Cf can be calculated as $$Cf = (T01(0/T01(i-1)-1)*Ck \quad (8)$$

For the key touch application, we only need to decide if there is a difference between the measured time data. Microcontroller 16 gets the latest T01 value T01(i) and compares it with the previous T01 value T01(i−1), or even traces back more data series, T01(i−2), T01(i−3) . . . , to help make decisions. The simplest example is to use the difference ΔT01=T01(i+i)−T01(i) to decide if a key is touched. The implementers can also use some signal processing and reasoning methods to increase reliability if needed. The formula for ΔT01 can be given as $$\Delta T01 = \ln(1/(1-Vth/V1))*R*Cf \quad (9)$$

The formulas of the time difference can give the estimations to choose the system parameters. An example of calculation is given here. When Vth=(½) V1, ΔT01=0.693 RC$_f$. Assume Cf=10 pf, R=3MΩ, then τ=R*Cf=30 μs, ΔT01 is about 20 μS.

From the formula (9) of ΔT01, we can see if that we adjust the amplitude V1 of the pulses Vp lower, or the ratio of Vth/V1 higher, we will increase ΔT01. Then the test margin and resolution are increased.

Figure 4A:
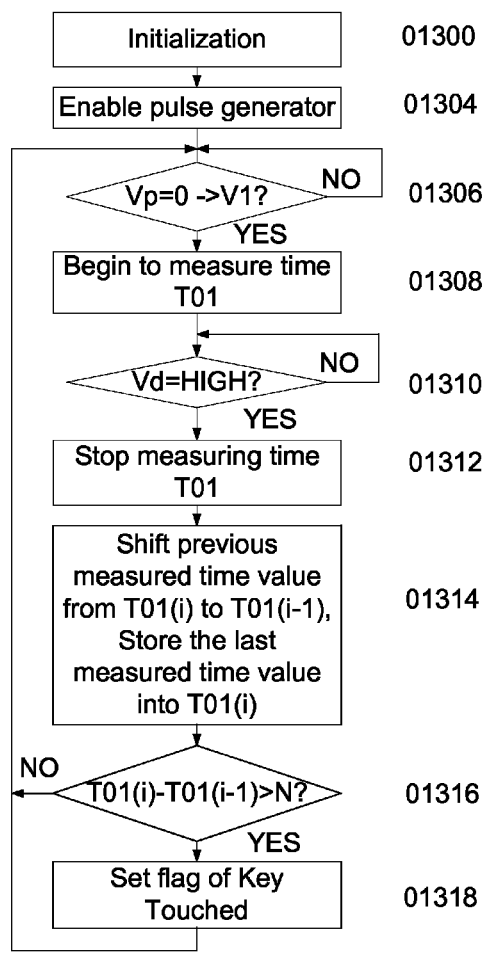
FIG. 4A is the flowchart of the operation of an example of key touch detection.

FIG. 4A is a flowchart that shows an example of the detailed operation to measure T01 based on the configuration and waveforms in FIG. 1B and FIG. 3B respectively.

At Step 01300, initialization sets up the system environment and also does necessary calibrations. At Step 01304, signal generator 18 begins to output Vp of pulses to charge capacitor 10. At Step 01306 and Step 01308, start measuring time T01 from the rising edge of Vp. A normal way to measure time is to start a counter that counts by a high frequency clock. Only the most basic steps are shown here; other possible steps, such as calibration, digital signal process, and logical reasoning, are not included. Similarly, by replacing Steps 01306 and 01310 with the conditions accordingly, T00 and T10 also can be measured by the same way.

Figure 4B:
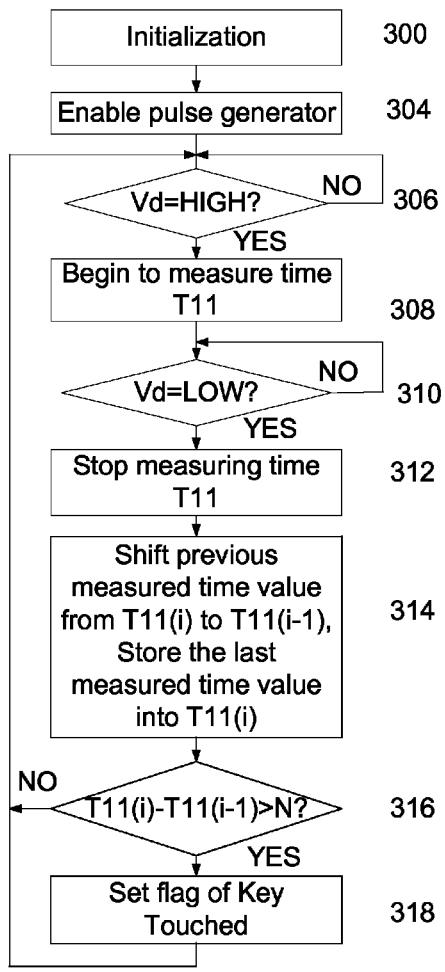
FIG. 4B is the flowchart of the operation of another example of key touch detection.

The flowchart in FIG. 4B shows an example of the detailed operation based on FIG. 1C and FIG. 3A to measure T11.

Besides the selection of the resistance value R of resistor 12, the pulse width and interval also give the choice to the implanters according to the factors, such as key touch, response time, measurement margins or resolutions, how many keys need to be handled, power consumptions on the keys, how the microcontroller handles other events in the system, etc.

To use T11 to decide key touch, the pulse duration T1 should not be too long to let capacitor 10 to get fully charged in both cases of touched and untouched. Otherwise T11 is always close to T1. If T1 is too short, Vc may not reach Vth for a pulse cycle, and the time value T11 will be 0.

The hardware and software combination in the microcontroller can provide many different ways to catch the time differences and to make the decision if a key is touched or not. It all depends on the implementers' choices. The affecting factors can be the complexity of the design, the trade-off between hardware and software, and usage balance between the key detection task and other tasks the microcontroller will take.

Here is the example of the least hardware-involved solution. Set a software loop and increase the value in memory locations or registers to count the time, and then toggle the digital output port P0 high and low to generate the pulse train (Step 304). Also in the loop, poll the digital input port to see if Vd is HIGH ("1") or LOW ("0") (Step 306 and 310).

Here is the example of the most hardware-involved solution. Internal timer, PWM, or interrupt are used to generate pulses (Step 304). Vd is used to trig an interrupt or enable a counter to start measuring time (Step 306); a hardware timer is used to measure the time (Step 308). This approach relieves microcontroller 16 from loop polling and allows it to handle other issues in the system.

DETAILED DESCRIPTION

FIGS. 2a, 2b, 3d, 3e—Additional Embodiment

Figure 2A:
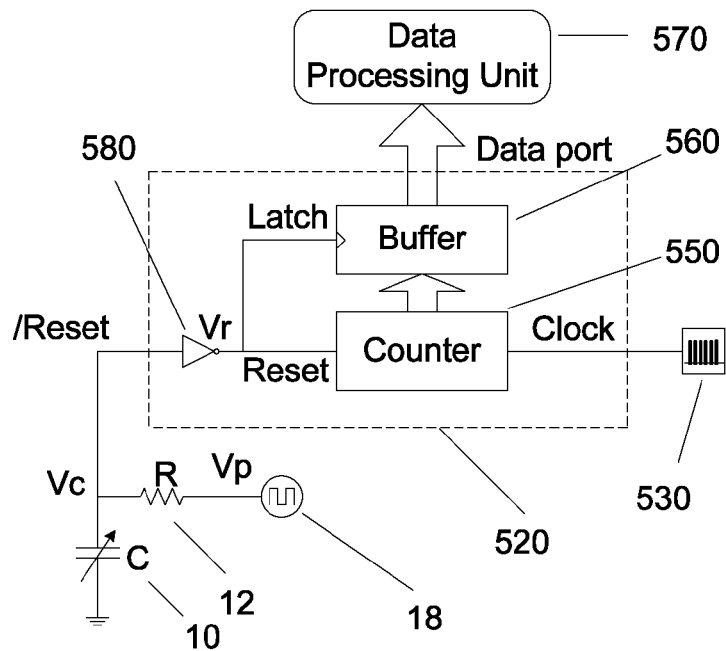
FIG. 2A is an example of a capacitive sensing system with hardwired circuitry.

FIG. 2A is an example using an all-hardware digital circuitry 520 to get the time data T11. T11 has been shown in FIG. 3A and discussed above. The parts with the same numerals are the same as in FIG. 1A and FIG. 1B. A digital measuring module 520 can be a single device or consist of multiple devices. A counter 550 has two inputs, the Reset and Clock. When Reset pin is in "1", the counter is cleared to zero. When Reset becomes "0", each clock will be counted inside. A clock generator 530 outputs high frequency clocks to counter 550. The higher the frequency that can be used, the higher the resolution that can be achieved. A buffer 560 stores each time data. The rising edge at Latch input pin of buffer 560 would transfer the counting result from counter 550 to buffer 560. A Data Processing Unit 570 reads the data from buffer 560 and processes. A logic gate 580 is the digital interface, which converts analogue signal Vc to digital signal Vr.

Figure 3D:
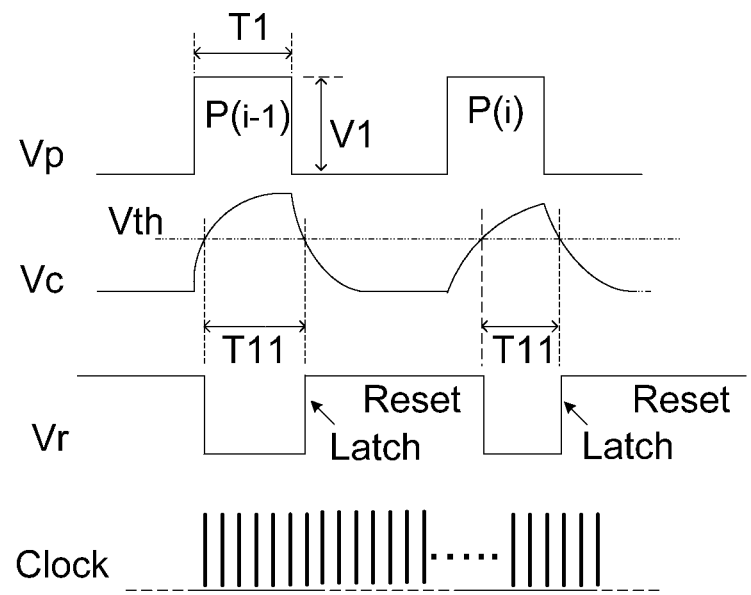
FIG. 3D shows the waveforms for the measurement with hardwired circuitry.

FIG. 3D gives the relations of the signal Vp, Vc, Vr, and Clock. The time value T11 is directly measured by the clock numbers of clock generator 530. For example, when the clock is set to 1 MHz and the counting number is 20, the time value T11 is $100*(1/10)=20(\mu S)$.

Signal generator 18 outputs a series of pulses P(i−1), P(i) . . . . Each pulse charges capacitor 10, while capacitor 10 discharges between two pulses. When the voltage Vc on capacitor 10 is charged higher than the Vth, the digital signal Vr from logic NOT gate 580 goes to "0". Then, Reset becomes "0" and counter 550 begins to count the clocks from Clock input pin. When Vc discharges down under Vth, Vr will go to "1", then Latch jumps from "0" to "1". T11 data on the output port OF Counter 550 is latched into buffer 560 by the rising edge of Latch. Meanwhile, Reset="1" clears and holds counter 550 to zero. Unit 570 or any other computing devices connected to the Data port of measuring module 520 can simply read in the time data and do the necessary processes.

Figure 2B:
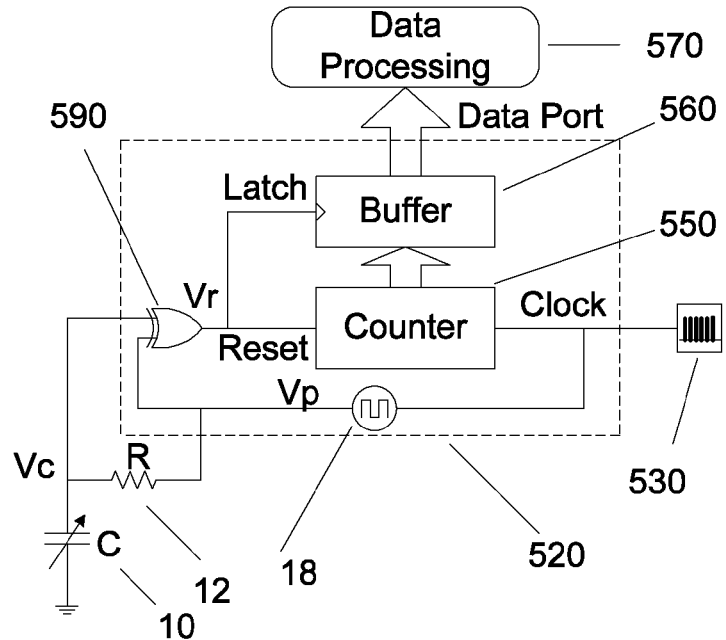
FIG. 2B is another example of a capacitive sensing system with hardwired circuitry.
Figure 3E:
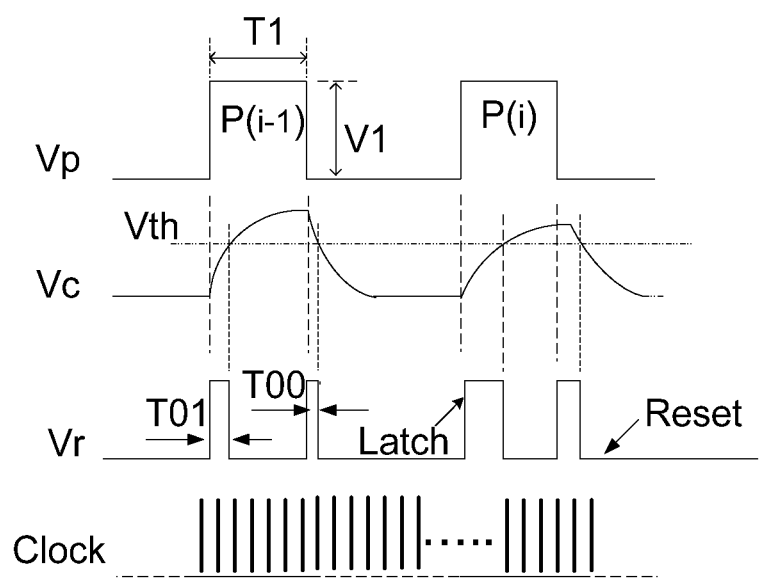
FIG. 3E shows the other waveforms for the measurement with hardwired circuitry.

Other time data mentioned in FIG. 3B as T00, T01, and T10, also can be measured with the similar circuitry. FIG. 2B gives another example to measure T01 and T00. FIG. 3E shows the related waveforms. Basically, in this embodiment, Vp is logic XOR with Vc, and the pulse widths of XOR gate's output Vr represent T01 and T00.

All the discussions for FIG. 1B about using the time data to measure the capacitance or make decision for key touch also can be applied to this embodiment.

Advantages

From the descriptions above, a number of advantages of some embodiments of my apparatus and methods for capacitive sensing and capacitive measuring become evident:

(a) All-digital circuit design.

(b) Only the single input mode of a digital I/O port for each key is required, which makes it easier to construct the hardwired circuit or glue logic, or use less CPU time than what the input and output modes are needed to switch back and forth.

(c) The measurement resolution and detection margin are enhanced by using the adjustable signal generator with different charging waveforms.

(d) Both charging and discharging periods can be used to do measurement to increase system design flexibility and resolution.

(e) Less cost to implement the key detection port from a regular/general purpose I/O port, and good compatibility with mechanical key detection circuitry.

(f) Flexible for the implementers to choose hardware, software, or their combinational solutions.

(g) A key can be constructed by a single conductive plate.

CONCLUSION, RAMIFICATIONS, AND SCOPE

Accordingly, the reader will see that, according to one embodiment of the capacitive sensing system, I have provided an easy and inexpensive way to build a capacitive touch sensing system by using a general purpose microcontroller as a touch sensing controller, adding a simple digital circuitry for each input port as a module in a microcontroller, or creating a hardwired simple IC to interface a computing device. Furthermore, the direct digital detection and single mode port configuration method have the additional advantages in that:

- it permits the existing design to add capacitive touch sensing function without requiring to change of the microcontroller to avoid porting the software from one microcontroller family to another one.
- it permits the existing microcontroller to upgrade to a capacitive touch sensing capability without changing IC design methodology and manufacturing process, and requiring additional expertise from the designers.
- it permits the existing microcontroller to upgrade to a capacitive touch sensing capability by adding a simple logic circuit to the ports to reduce the CPU usage while keeping compatibility to each port's original function as well as the price to the customers.
- by using the similar circuit or compatible circuit to detect a mechanic key pressing, the cost of the touch sensing electronic component IC would be the similar to that used for mechanic key. In this solution, only general purpose input port is needed for a key. Also for an embodiment, one digital output port is used as signal source to charge and discharge one or more touch plates which are equivalent to the grounded capacitors. Considering that there will be no additional parts that need to be assembled for a touch sensing key, the total cost of my capacitive touch sensing key solution would be possibly cheaper than a mechanical key solution when the key detection controllers are similar and with about the same cost.

While the above description contains many specificities, these should not be constructed as limitations on the scope of any embodiment, but as exemplifications of the presently preferred embodiments thereof. Many other ramifications and variations are possible within the teachings of various embodiments. For example, a resistance element can be place right before the input port, and/or right after the capacitive element, etc.

Thus the scope of the invention should be determined by the appended claims and their legal equivalents, and not by the examples given.

I claim:

1. A capacitive sensing system comprising a microcontroller having at least one external digital input port which is not an output port, an electric signal generator which changes voltage in a predetermined timing, a capacitive sensing element in electrical communication with said digital input port, and a resistive element providing a charge and discharge path between said capacitive sensing element and said electric signal generator.

2. The capacitive sensing system of claim 1 wherein said signal generator charges and discharges said sensing element by placing certain levels of voltage in selected times, and causes the voltage on said sensing element to pass through the logic threshold level of said digital input port.

3. The capacitive sensing system of claim 1 wherein said signal generator is an external output port of said microcontroller, and said microcontroller charges said sensing element by causing a higher than logic threshold level voltage to be placed on said output port in a selected time, and discharges by causing a lower than logic threshold level voltage to be placed on said output port in a selected time.

4. The capacitive sensing system of claim 1 wherein said microcontroller is further operable to measure a time from a certain reference point of a charging waveform to the logic high of said input port, or from a certain reference point of a discharging waveform to the logic low from said input port, the voltage at said input port being representative of voltage at said sensing element; process the time value to get measurement results or determine touching action.

5. An apparatus for measuring capacitance of a capacitive sensing element, comprising: a) a digital circuitry having at least one external digital input port, b) an electric signal generator which changes voltage in a predetermined timing, c) a capacitive sensing element in electrical communication with said input port, d) a resistive element providing a charge and discharge path between said sensing element and said signal generator.

6. The apparatus of claim 5 wherein said signal generator charges and discharges said sensing element by placing certain levels of voltage in selected times, and causes the voltage on said sensing element to pass through the logic threshold level of said digital input port.

7. The apparatus of claim 5 wherein said signal generator is further operable to: charge said sensing element by applying a higher than logical threshold level voltage on said resistance element in a selected time, and discharge by applying a lower than logic threshold level voltage in a selected time.

8. The apparatus of claim 5 wherein said digital circuitry has an Exclusive-OR digital logic unit which has said digital input as the first input, the output of said signal generator as the second input, and an output to influence the operations of a digital counter.

9. The apparatus of claim 5 wherein said digital circuitry is embedded in a microcontroller.

10. The apparatus of claim 5 wherein said digital circuitry is readable for a time value from an interface.

11. A method of capacitive sensing, the method comprising: (a) providing a microcontroller, having at least one external digital input port, (b) providing a capacitive element in electrical communication with said input port, (c) providing a resistance element in electrical communication with said sensing element to form an electrical pathway from the output port, (d) providing an adjustable signal generator with an output port, and (e) configuring said microcontroller to: (f) charge said sensing element by causing a higher than logic threshold level voltage to be placed on said output port in a selected time, and discharge by causing a lower than logic threshold level voltage to be placed on said output port in a selected time. (g) measure a time from a certain reference point of a charging waveform to the logic high from said input port, or from a certain reference point of a discharging waveform to the logic low from said input port, the voltage at said input port being representative of voltage at said sensing element; (h) process the time value to get measurement results or determine touching action.

* * * * *